(12) United States Patent
Lee

(10) Patent No.: US 8,900,947 B2
(45) Date of Patent: Dec. 2, 2014

(54) SEMICONDUCTOR DEVICES INCLUDING CONDUCTIVE PLUGS AND METHODS OF MANUFACTURING THE SAME

(75) Inventor: Jin Yul Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 13/615,179

(22) Filed: Sep. 13, 2012

(65) Prior Publication Data

US 2013/0193549 A1     Aug. 1, 2013

(30) Foreign Application Priority Data

Jan. 31, 2012   (KR) .................... 10-2012-0009844

(51) Int. Cl.
*H01L 21/00*     (2006.01)
(52) U.S. Cl.
USPC .................... 438/259; 438/270; 438/271
(58) Field of Classification Search
CPC .............. H01L 27/108; H01L 21/76831
USPC .................................. 438/259, 270–271
See application file for complete search history.

(56) References Cited

U.S. PATENT DOCUMENTS 8,507,344 B2 *   8/2013   Kim .............................. 438/270

FOREIGN PATENT DOCUMENTS

| KR | 1020050000208 A | 1/2005 |
| KR | 1020060135292 A | 12/2006 |
| KR | 1020100076704 A | 7/2010 |
| KR | 1020110024494 A | 3/2011 |
| KR | 1020110078115 A | 7/2011 |

* cited by examiner

*Primary Examiner* — Tran Tran
(74) *Attorney, Agent, or Firm* — William Park & Associates Patent Ltd.

(57) ABSTRACT

Methods of manufacturing a semiconductor device are provided. The method includes forming an isolation region in a substrate to define active regions extending in a single direction and being spaced apart from each other by the isolation region, forming a conductive layer in the isolation region and the active regions, etching the conductive layer to form bit line trenches extending in a first direction that is non-perpendicular to the single direction, forming bit line patterns in respective ones of the bit line trenches, etching the conductive layer to form a plurality of plug trenches two dimensionally arrayed along the first direction and a second direction perpendicular to the first direction, and filling the plug trenches with an insulation material to define conductive plug patterns in portions of the active regions. Related semiconductor devices are also provided.

20 Claims, 22 Drawing Sheets

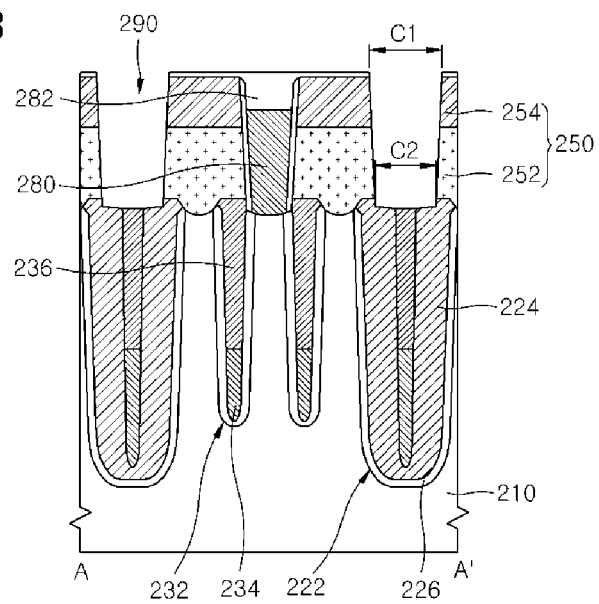
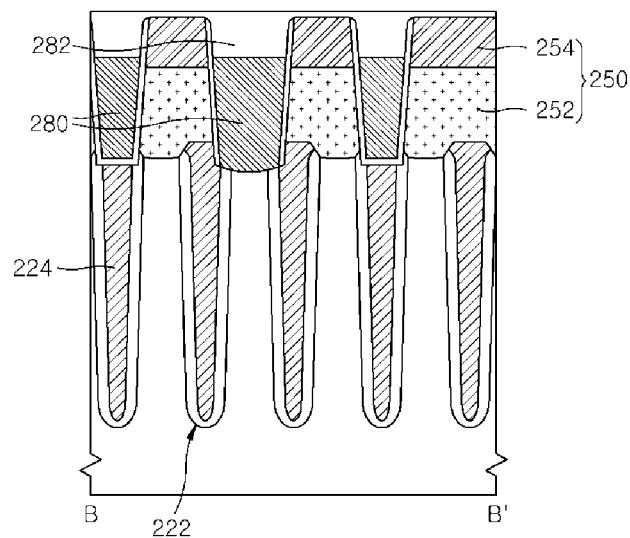

SEMICONDUCTOR DEVICES INCLUDING CONDUCTIVE PLUGS AND METHODS OF MANUFACTURING THE SAME

CROSS-REFERENCES TO RELATED APPLICATIONS

The present application claims priority under 35 U.S.C. 119(a) to Korean Application No. 10-2012-0009844, filed on Jan. 31, 2012, in the Korean intellectual property Office, which is incorporated herein by reference in its entirety as set forth in full.

BACKGROUND

Example embodiments of the present disclosure relate to semiconductor devices and methods of manufacturing the same and, more particularly, to semiconductor devices including conductive plugs and methods of manufacturing the same.

Dynamic random access memory (DRAM) devices well known in the semiconductor industry may include a plurality of transistors and a plurality of capacitors. In general, the transistors may be formed in and on a substrate, and the capacitors may be formed over the transistors. Conductive plugs may be formed on source regions of the transistors to electrically connect the transistors to the capacitors. The conductive plugs may electrically connect the source regions of the transistors to storage node electrodes of the capacitors. Further, other conductive plugs, for example, bit line contact plugs may be formed on drain regions of the transistors to electrically connect the transistors to bit lines.

As semiconductor devices become more highly integrated, critical dimensions (CDs) of line widths of the semiconductor devices have been continuously reduced. Accordingly, it may be difficult to increase a process margin in the fabrication of the conductive plugs. For example, when the critical dimensions (CDs) of the line widths of the semiconductor devices are reduced, there may be some limitations in obtaining sufficient overlay margins between the conductive plugs and the underlying layers (e.g., the active regions) during a photolithography process for forming contact holes to be filled with the conductive plugs.

SUMMARY

Example embodiments are directed to semiconductor devices and methods of manufacturing the same.

According to some embodiments, a method of manufacturing a semiconductor device includes forming an isolation region in a substrate to define active regions extending in a single direction and being spaced apart from each other by the isolation region, forming a conductive layer in the isolation region and the active regions, etching the conductive layer to form bit line trenches extending in a first direction that is non-perpendicular to the single direction, forming bit line patterns in respective ones of the bit line trenches, etching the conductive layer to form a plurality of plug trenches two dimensionally arrayed along the first direction and a second direction perpendicular to the first direction, and filling the plug trenches with an insulation material to define conductive plug patterns in portions of the active regions.

The method may further include forming word lines in the substrate before the conductive layer is formed in the isolation region and the active regions. The word lines may be formed to intersect the active regions and extend in the second direction.

The conductive layer may be formed to include at least two layers selected from the group consisting of a doped silicon layer, a titanium (Ti) layer, a titanium nitride (TiN) layer, a tungsten (W) layer, a tungsten nitride (WN) layer, a tantalum (Ta) layer and a tantalum nitride (TaN) layer.

Forming the conductive layer in the isolation region and the active regions may include forming a doped silicon layer in the isolation region and the active regions, sequentially forming a titanium layer and a titanium nitride layer on the doped silicon layer, and forming a tungsten layer on the titanium nitride layer.

Forming the bit line patterns may include forming a separating insulation layer on sidewalls and bottom surfaces of the bit line trenches, etching the separating insulation layer using a bit line contact mask as an etch mask to form bit line contact regions that expose portions of the active regions, sequentially forming a titanium layer and a titanium nitride layer on the separating insulation layer and in the bit line contact regions, filling the bit line trenches surrounded by the titanium nitride layer with a tungsten layer, recessing the tungsten layer in the bit line trenches, and filling the bit line trenches on the recessed tungsten layer with a capping insulation layer. The separating insulation layer may include at least one of a silicon oxide layer, a silicon nitride layer and a silicon oxynitride layer.

Etching the conductive layer to form a plurality of plug trenches may include patterning the conductive layer such that the conductive plug patterns remain on both edges of the active regions.

The conductive plug patterns may be formed such that a lower width of each conductive plug pattern is greater than an upper width thereof.

The method may further include forming storage node electrodes on respective ones of the conductive plug patterns.

According to further embodiments, a method of manufacturing a semiconductor device includes forming an isolation region in a substrate to define active regions extending in a single direction and being spaced apart from each other by the isolation region, forming a multi-layered conductive layer on the substrate including the isolation region, etching the conductive layer to form first trenches crossing over central portions of the active regions and extending in a first direction that is non-perpendicular to the single direction, forming conductive line patterns in respective ones of the first trenches, etching the conductive layer to form a plurality of second trenches two dimensionally arrayed along the first direction and a second direction perpendicular to the first direction, and filling the second trenches with an insulation material to define conductive plug patterns on portions of the active regions.

Forming the multi-layered conductive layer may include forming a doped silicon layer on the substrate including the isolation region, forming a titanium layer and a titanium nitride layer on the doped silicon layer, and forming a tungsten layer on the titanium nitride layer.

Forming the conductive line patterns may include forming a separating insulation layer on sidewalls and bottom surfaces of the first trenches, etching the separating insulation layer to form contact regions that expose portions of the active regions, sequentially forming a titanium layer and a titanium nitride layer on the separating insulation layer and in the contact regions, filling the first trenches surrounded by the titanium nitride layer with a tungsten layer, recessing the tungsten layer in the first trenches, and filling the first trenches on the recessed tungsten layer with a capping insulation layer.

The method may further include forming conductive lines in the substrate before the multi-layered conductive layer is formed on the substrate. The conductive lines may be formed to intersect the active regions and to extend in the second direction.

The conductive plug patterns may be formed such that a lower width of each conductive plug pattern is greater than an upper width thereof.

According to further embodiments, a semiconductor device includes active regions disposed in a substrate to extend along a single direction and insulated from each other by an isolation region, bit line patterns crossing over the active regions and extending in a first direction that is non-perpendicular to the single direction, and conductive plug patterns disposed between the bit line patterns and two dimensionally arrayed along the first direction and a second direction perpendicular to the first direction. The conductive plug patterns are disposed in portions of the active regions.

A lower width of each of the conductive plug patterns may be greater than an upper width thereof.

Each of the conductive plug patterns may include at least two layers selected from the group consisting of a doped silicon layer, a titanium (Ti) layer, a titanium nitride (TiN) layer, a tungsten (W) layer, a tungsten nitride (WN) layer, a tantalum (Ta) layer and a tantalum nitride (TaN) layer.

Each of the conductive plug patterns may include a doped silicon layer, a titanium (Ti) layer, a titanium nitride (TiN) layer and a tungsten (W) layer which are sequentially stacked.

Each of the bit line patterns may include a bit line conductive layer, a separating insulation layer surrounding a bottom surface and sidewalls of the bit line conductive layer, and a capping insulation layer on a top surface of the bit line conductive layer.

The conductive plug patterns may be disposed on both edges of the active regions.

BRIEF DESCRIPTION OF THE DRAWINGS

Embodiments of the inventive concept will become more apparent in view of the attached drawings and accompanying detailed description.

FIGS. 2A to 11A are plan views illustrating methods of manufacturing semiconductor devices according to some example embodiments and semiconductor devices manufactured thereby.

FIGS. 2B to 11B are cross sectional views taken along lines A-A' of FIGS. 2A to 11A, respectively.

FIGS. 2C to 11C are cross sectional views taken along lines B-B' of FIGS. 2A to 11A, respectively.

DESCRIPTION OF SPECIFIC EMBODIMENTS

Figure 1:
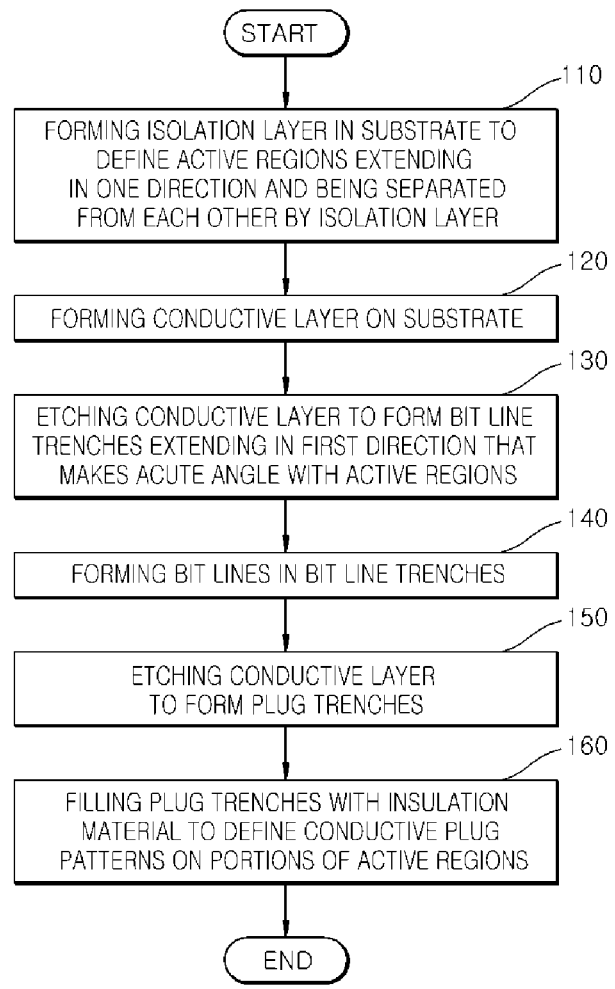
FIG. 1 is a flowchart illustrating a method of manufacturing a semiconductor device according to an example embodiment.

Example embodiments will be described more fully hereinafter with reference to the accompanying drawings. Many different forms and embodiments are possible without deviating from the spirit and teachings of this disclosure and so the disclosure should not be construed as limited to the example embodiments set forth herein. Rather, these embodiments are provided so that this disclosure will be thorough, and will convey a scope of the disclosure to those skilled in the art. In the drawings, the sizes and relative sizes of layers and regions may be exaggerated for clarity. The same reference numerals or the same reference designators denote the same elements throughout the specification.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Further, in the fabrication methods, sequences of the fabrication process steps according to the inventive concept may be different from the sequences as described in the example embodiments, unless the context clearly indicates otherwise. That is, the process steps for fabricating semiconductor devices according to example embodiments may be performed in the same orders as described in the example embodiments or may be performed in different orders from the sequences as described in the example embodiments, unless the context clearly indicates otherwise.

In the example embodiments, active regions are regions in which source regions and drain regions of transistors are formed.

The active regions may have oval shapes or polygonal shapes in a plan view. When the active regions have the oval shapes, each of the active regions may have a major axis and a minor axis.

Recently, a unit cell of DRAM devices has been designed to have a cell layout area of $6F^2$ in order to increase the integration density of the DRAM devices. The character "F" of the cell layout area $6F^2$ may denote a minimum feature size. In the $6F^2$ cell layout, the active regions may be disposed such that major axes of the active regions are non-perpendicular to bit lines and/or word lines. For example, when the word lines are parallel with an x-axis and the bit lines are parallel with a y-axis in an orthogonal coordinate system having the x-axis and the y-axis, the active regions may be disposed to be parallel with a diagonal line that is non-parallel with the x-axis and the y-axis. In contrast, according to an $8F^2$ cell layout, major axes of the active regions may be parallel with the bit lines or the word lines. The $6F^2$ cell layout may have a cell area which is smaller than a cell area of the $8F^2$ cell layout. Thus, spaces between adjacent conductive lines in the $6F^2$ cell layout may be smaller than spaces between adjacent conductive lines in the $8F^2$ cell layout. Thus, it may be difficult to increase a process margin in the fabrication of DRAM cells designed in the $6F^2$ cell layouts.

FIG. 1 is a flowchart illustrating a method of manufacturing a semiconductor device according to an embodiment. Referring to FIG. 1, an isolation region may be formed in a substrate to define active regions in block 110. The active regions may be defined to extend in a single direction which is parallel with a main surface of the substrate and the active regions may be separated from each other by the isolation region. Further, the active regions may be electrically insulated from each other by the isolation region. Each of the active regions may be defined to have a major axis and a minor axis which are parallel with the main surface of the substrate and are perpendicular to each other. The major axes of the active regions may be parallel to the single direction. In an embodiment, the isolation region may be formed using a shallow trench isolation (STI) process.

In block 120, a conductive layer may be formed in the isolation region and in the active regions on the substrate including the isolation region. The conductive layer may be formed to include a doped silicon layer, a metal layer or a metal nitride layer. For example, the conductive layer may be formed of a multi-layered material having at least two layers selected from the group consisting of a doped silicon layer, a titanium (Ti) layer, a titanium nitride (TiN) layer, a tungsten (W) layer, a tungsten nitride (WN) layer, a tantalum (Ta) layer and a tantalum nitride (TaN) layer. In an embodiment, the conductive layer may be formed using an evaporation process, a sputtering process, a chemical vapor deposition (CVD) process or an atomic layer deposition (ALD) process.

In block 130, the conductive layer may be etched to form first trenches extending in a first direction that is non-perpendicular to the major axes of the active regions. In an embodiment, the first trenches may correspond to bit line trenches. The first trenches may be formed to cross central portions of the active regions.

In block 140, conductive line patterns may be formed in respective ones of the first trenches. When the first trenches are bit line trenches, the conductive line patterns may correspond to bit line patterns of a semiconductor device. In an embodiment, prior to formation of the conductive line patterns, a separating insulation layer may be formed on sidewalls and bottom surfaces of the first trenches. The separating insulation layer may be then etched to form contact regions that expose portions of the active regions. A titanium layer and a titanium nitride layer may be sequentially formed on the separating insulation layer and on the contact regions. A tungsten layer may be formed in the first trenches surrounded by the titanium nitride layer and the titanium layer. The tungsten layer may be recessed and a sealing insulation layer (also referred to as a capping insulation layer) may be formed to fill the first trenches on the recessed tungsten layer. The titanium layer, the titanium nitride layer and the tungsten layer may be formed using an evaporation process, a sputtering process, a chemical vapor deposition (CVD) process or an atomic layer deposition (ALD) process.

In a block 150, the conductive layer may be etched to form a plurality of second trenches. In an embodiment, the second trenches may be formed by selectively etching the conductive layer using a mask pattern having a plurality of line-shaped openings as an etch mask. The line-shaped openings of the mask pattern may be parallel with a second direction that is perpendicular to the first direction. While the conductive layer is selectively etched to form the second trenches, the conductive line patterns, for example, the bit line patterns may not be etched. Thus, the second trenches may be formed to include a plurality of island-shaped contact holes that are two dimensionally arrayed along the first and second directions.

In a block 160, the second trenches may be filled with an insulation material, and conductive patterns remaining between the second trenches may act as conductive plug patterns. In an embodiment, the conductive plug patterns may be formed to remain on both edges of the active regions. In some embodiments, storage node electrodes may be formed on respective ones of the conductive plug patterns, and the storage node electrodes may be electrically connected to respective ones of source regions (or drain regions) of transistors formed in the active regions through the conductive plug patterns.

According to the above example embodiment, each of the second trenches may be formed to have negative sloped sidewalls because of the nature of the etching process (e.g., a dry etching process). That is, an upper width of each second trench may be greater than a lower width thereof. Thus, the conductive plug patterns existing between the second trenches may be formed to have positive sloped sidewalls. As a result, a lower width of each conductive plug pattern may be greater than an upper width thereof. Accordingly, contact areas between the active regions and the conductive plug patterns may be increased. Consequently, an electrical contact resistance between the source regions (or drain regions) and the conductive plug patterns may be reduced.

Further, the conductive plug patterns may be formed by depositing a conductive layer on an entire surface of the substrate including cell transistors and by patterning the conductive layer. Thus, the conductive plug patterns can be formed without any voids of seams therein. In contrast, according to the conventional art, the conductive plug patterns may be formed by depositing an insulation layer on an entire surface of a substrate, by patterning the insulation layer to form storage node contact holes exposing portions of active regions, and by filling the storage node contact holes with a conductive layer. In this case, if the storage node contact holes have high aspect ratios, voids or seams may be formed in the conductive layer filling the storage node contact holes while the conductive layer is deposited to fill the storage node contact holes. Accordingly, the conductive plug patterns may be formed to have voids or seams therein according to the conventional art.

In addition, according to the above example embodiment, the conductive plug patterns may be formed by etching or patterning a conductive layer after the conductive layer is formed of a multi-layered material having a silicon layer and a metallic layer. Thus, an annealing process for forming an ohmic contact between the silicon layer and the metallic layer may be more readily performed before the multi-layered material is etched or patterned. Consequently, the conductive plug patterns may be formed to have a high electrical conductivity with high reliability. In contrast, according to the conventional art, after the storage node contact holes are formed, a silicon layer and a metallic layer may be sequentially formed in the storage node contact holes to form the conductive plug patterns. In this case, it may be difficult to uniformly perform an annealing process for forming an ohmic contact between the silicon layer and the metallic layer in all the storage node contact holes.

Methods of manufacturing semiconductor devices according to example embodiments will be described more fully hereinafter with reference to the accompanying drawings.

FIGS. 2 to 11 are drawings illustrating methods of manufacturing semiconductor devices according to some embodiments. Specifically, FIGS. 2A to 11A are plan views illustrating methods of manufacturing semiconductor devices according to some embodiments and semiconductor devices manufactured thereby. FIGS. 2B to 11B are cross sectional views taken along lines A-A' of FIGS. 2A to 11A, respectively. FIGS. 2C to 11C are cross sectional views taken along lines B-B' of FIGS. 2A to 11A, respectively.

Figure 2A:
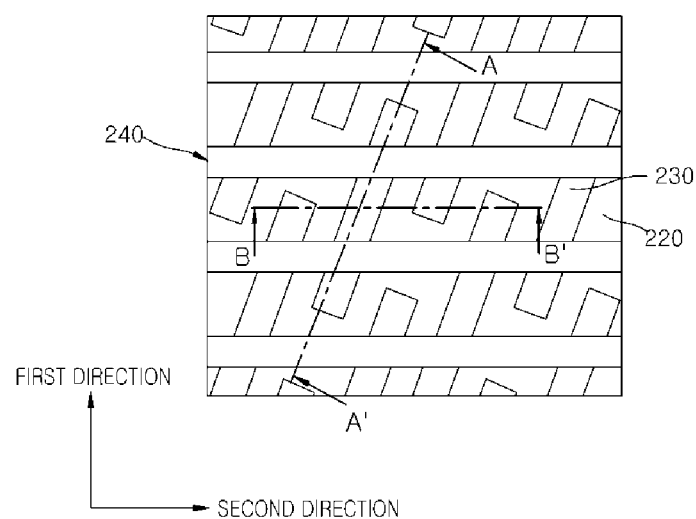
Figure 2B:
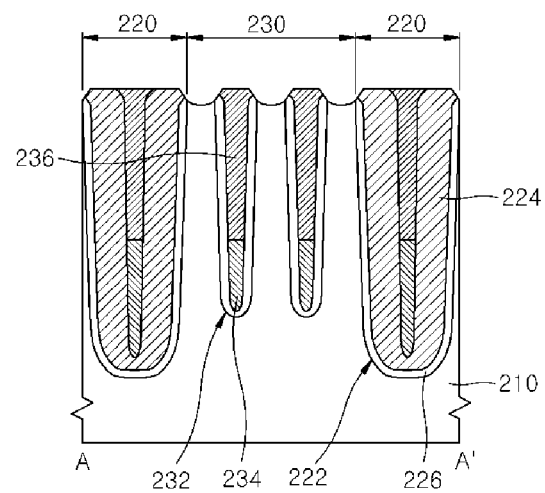
Figure 2C:
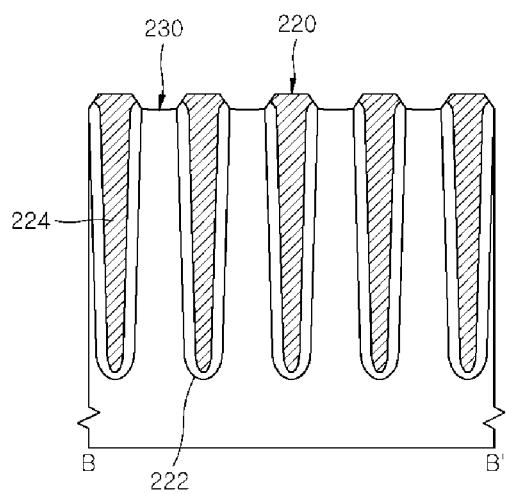

Referring to FIGS. 2A, 2B and 2C, an isolation region 220 may be formed in a substrate 210 to define active regions 230. As illustrated in FIGS. 2A, the active regions 230 may be formed to have major axes that extend in a single direction. The isolation region 220 may be formed using a shallow trench isolation (STI) process. In an embodiment, the isolation region 220 may be formed by etching the substrate 210 to form an isolation trench 222 and by filling the isolation trench 222 with an insulation layer 224. The insulation layer 224 may be formed of, for example, a oxide layer, a nitride layer and an oxynitride layer. In some embodiments, a liner layer 226 may be formed on an inner surface of the isolation trench 222 prior to formation of the insulation layer 224.

Referring again to FIGS. 2A, 2B and 2C, word lines 240 intersecting the active regions 230 may be formed to extend in a second direction. Each of the active regions 230 may be divided into three regions by two adjacent word lines 240. In other words, there may be at least three active regions 230 defined by two adjacent word lines 240. The second direction may be non-perpendicular to the major axes of the active regions 230, as illustrated in FIG. 2A. In an embodiment, a method of forming the word lines 240 may include etching the active regions 230 and the isolation region 220 to form trenches 232 extending in the second direction, forming a gate insulation layer (not shown) on inner surfaces of the trenches 232, forming gate conductive layers 234 that fills lower portions of the trenches 232 surrounded by the gate insulation layer, and forming capping insulation layers 236 that fills upper portions of the trenches 232 on the gate conductive layers 234. The capping insulation layers 236 may be formed of, for example, an oxide layer, a nitride layer or an oxynitride layer. Each of the word lines 240 may include the gate conductive layer 234 and the capping insulation layer 236 sequentially stacked in each trench 232.

Figure 3A:
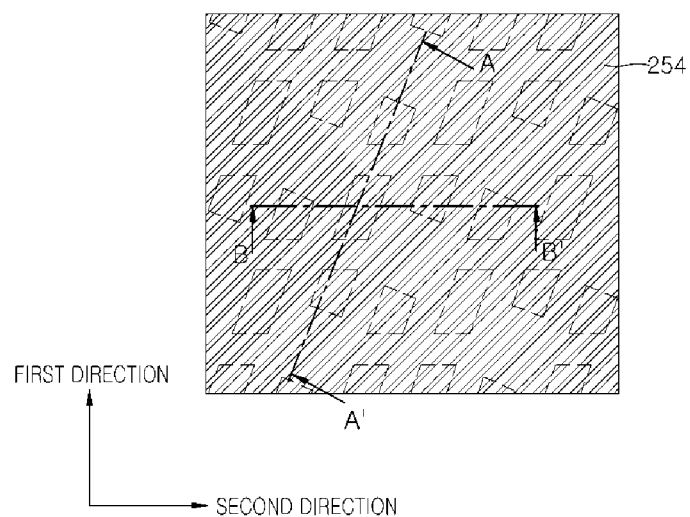
Figure 3B:
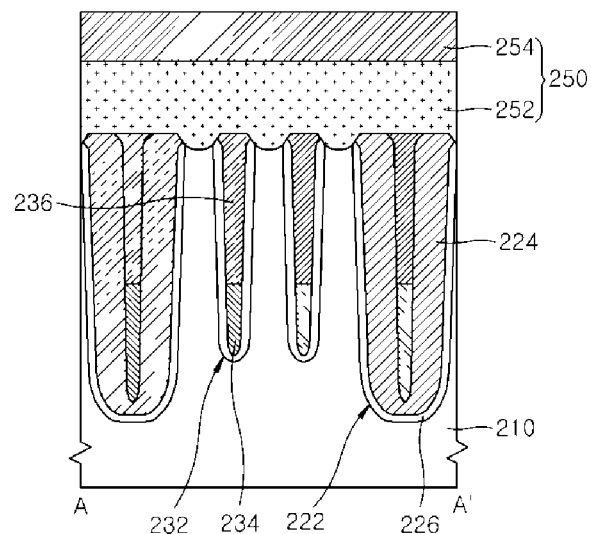
Figure 3C:
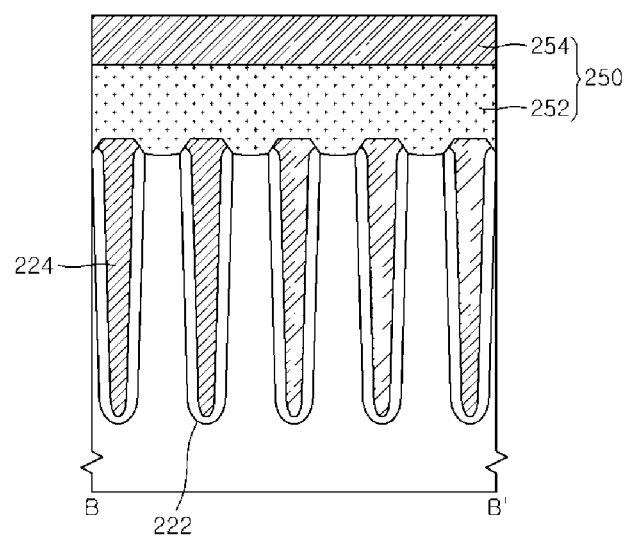

Referring to FIGS. 3A, 3B and 3C, a conductive layer 250 may be formed on an entire surface of the substrate including the isolation region 224 and the word lines 240. The conductive layer 250 may be formed to include, for example, a doped silicon layer, a metal layer or a metal nitride layer. In an embodiment, the conductive layer 250 may be formed of a multi-layered material including a doped silicon layer and a metallic layer sequentially stacked. The metallic layer constituting the conductive layer 250 may include at least two layers selected from the group consisting of a titanium (Ti) layer, a titanium nitride (TiN) layer, a tungsten (W) layer, a tungsten nitride (WN) layer, a tantalum (Ta) layer and a tantalum nitride (TaN) layer.

According to an embodiment, the conductive layer 250 may be formed by sequentially stacking a doped silicon layer 252, a titanium layer (not shown), a titanium nitride layer (not shown), and a tungsten layer 254 on the substrate including the isolation region 224 and the word lines 240. Thus, the titanium layer and the titanium nitride layer may be formed on the doped silicon layer 252. The doped silicon layer 252 may be formed in the isolation region 220 and the active regions 230. The tungsten layer 254 may be formed on the titanium nitride layer. The word lines, 240 may be formed in the substrate 210 before the conductive layer 250 is formed in the isolation region 220 and the active regions 230. An annealing process may be performed to realize ohmic contacts between the doped silicon layer 252, the titanium layer (not shown), the titanium nitride layer (not shown), and the tungsten layer 254 stacked on the substrate. During the annealing process, the doped silicon layer 252 and the titanium layer may react on each other to form a titanium silicide (TiSi) layer acting as an ohmic contact layer therebetween. The titanium layer may serve as an adhesive layer between the doped silicon layer 252 and the tungsten layer 254, and the titanium nitride layer may serve as a diffusion barrier layer between the doped silicon layer 252 and the tungsten layer 254. The conductive layer 250 may be deposited using at least one of an evaporation process, a sputtering process, a chemical vapor deposition (CVD) process and an atomic layer deposition (ALD) process. Some portions of the conductive layer 250 may be transformed into plug patterns contacting portions of the active regions 230 through subsequent processes, for example, patterning processes. Since the plug patterns are formed by patterning the conductive layer 250, the plug patterns may exhibit an excellent electrical characteristic, for example, a stable and reliable electrical conductivity.

Figure 4A:
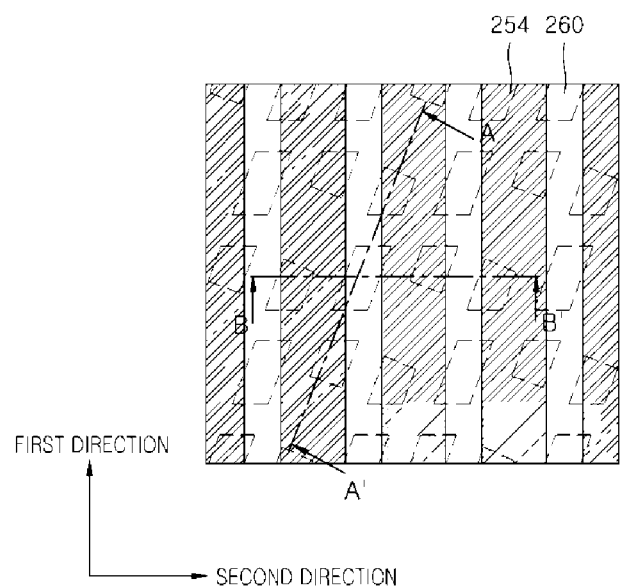
Figure 4B:
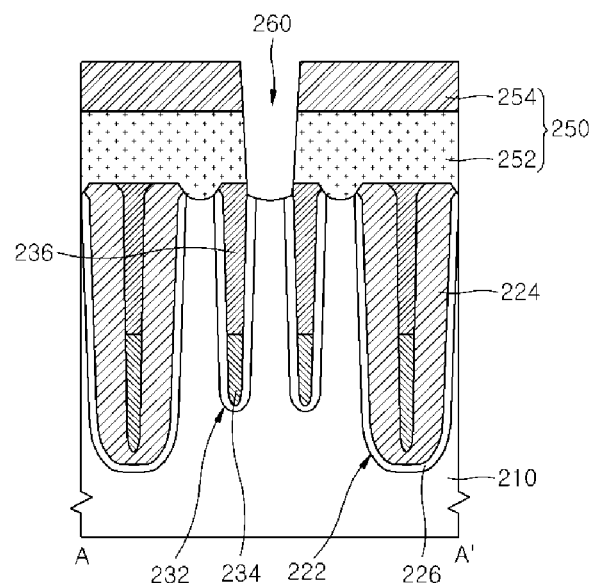
Figure 4C:
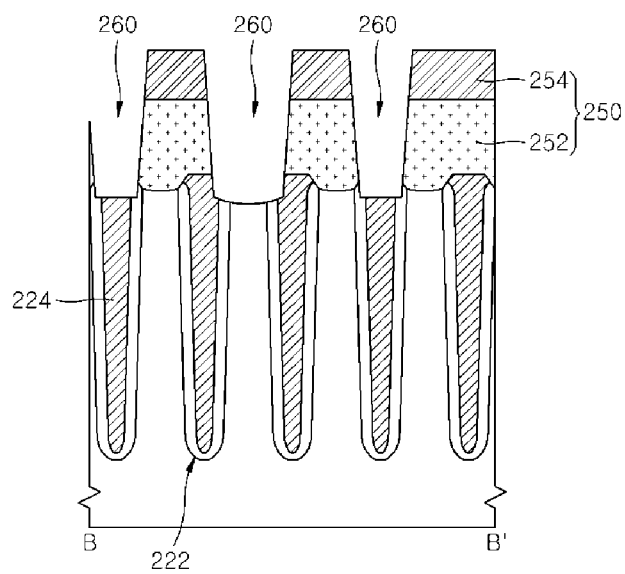

Referring to FIGS. 4A, 4B and 4C, the conductive layer 250 may be selectively etched to form a plurality of bit line trenches 260 extending in a first direction. As illustrated in FIG. 4A, the first direction may be non-perpendicular to the major axes of the active regions 230. Further, the first direction may be perpendicular to the second direction. The bit line trenches 260 having line shapes may be formed to cross over central portions of the active regions 230. The bit line trenches 260 may be formed to expose the central portions of the active regions 230. The exposed central portions of the active regions 230 may be in contact with bit lines of a semiconductor device.

Figure 5A:
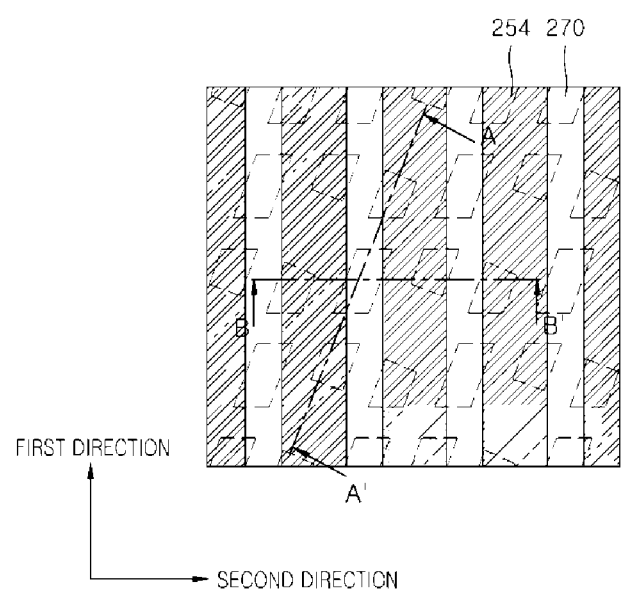
Figure 5B:
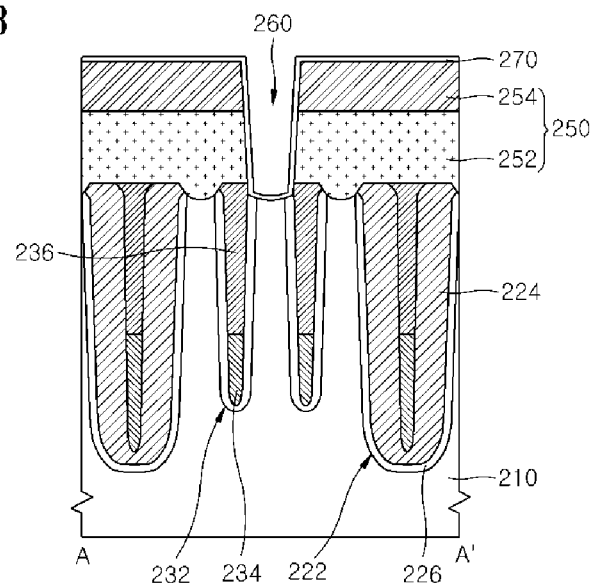
Figure 5C:
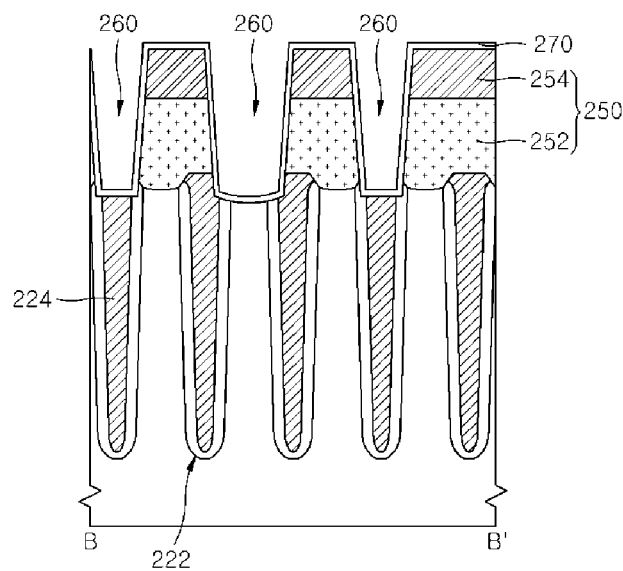

Referring to FIGS. 5A, 5B and 5C, a separating insulation layer 270 may be formed on the substrate including the bit line trenches 260. The separating insulation layer 270 may be conformally formed on sidewalls and bottom surfaces of the bit line trenches 260. The separating insulation layer 270 may be formed of, for example, a nitride layer, an oxide layer or an oxynitride layer. The separating insulation layer 270 may be formed to a thickness of about 80 angstroms (Å) to about 150 angstroms (Å). In an embodiment, the separating insulation layer 270 may be formed of a nitride layer that is deposited by a chemical vapor deposition (CVD) process performed at a temperature of about 650° C. to about 710° C. Alternatively, the separating insulation layer 270 may be formed of an oxide layer that is deposited by an atomic layer deposition (ALD) process performed at a temperature of about 100° C.

Figure 6A:
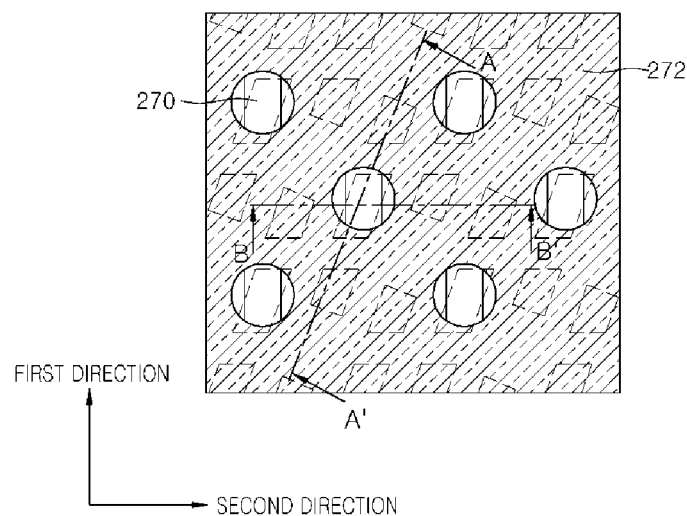
Figure 6B:
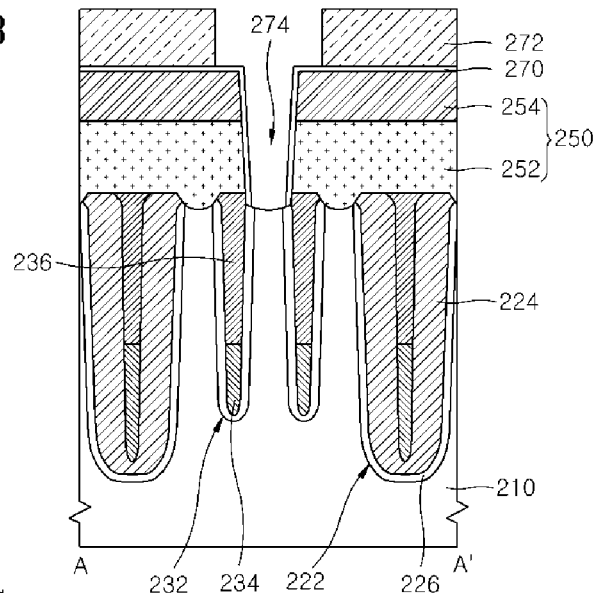
Figure 6C:
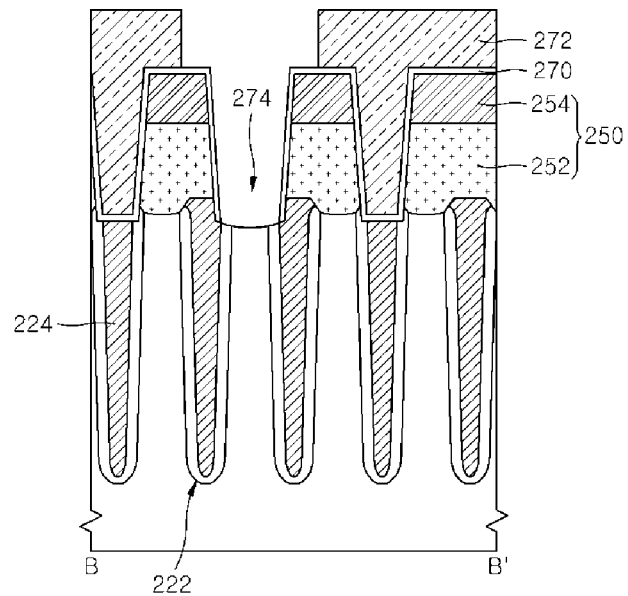

Referring to FIGS. 6A, 6B and 6C, the separating insulation layer 270 may be etched using a photolithography process that utilizes a bit line contact mask (not shown), thereby forming bit line contact regions 274 that expose portions (e.g., central portions) of the active regions 230. According to an embodiment, a resist layer may be coated on the separating insulation layer 270. The resist layer may be then patterned using a photolithography process that utilizes a bit line contact mask (not shown), thereby forming a resist pattern 272. The resist pattern 272 may be formed to have a plurality of hole-shaped openings that are located over the central portions of the active regions 230. Subsequently, the separating insulation layer 270 may be etched using the resist pattern 272 as an etch mask, thereby forming the bit line contact regions 274 that expose portions (e.g., central portions) of the active regions 230. The separating insulation layer 270 may be etched by an anisotropic dry etching process using plasma.

Figure 7A:
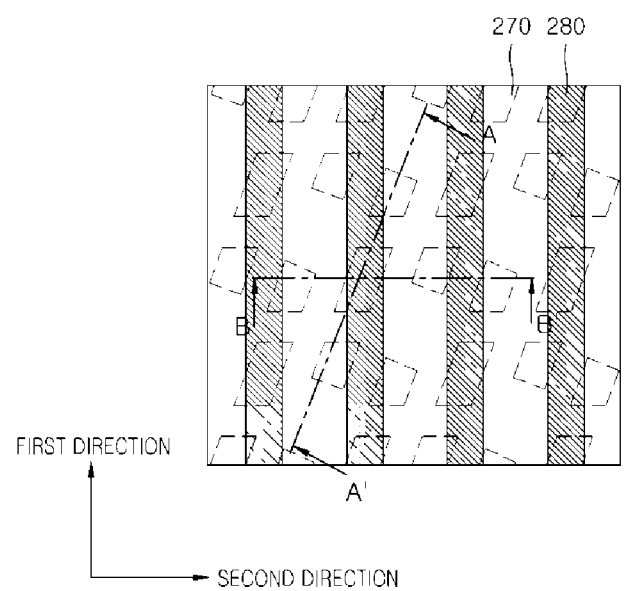
Figure 7B:
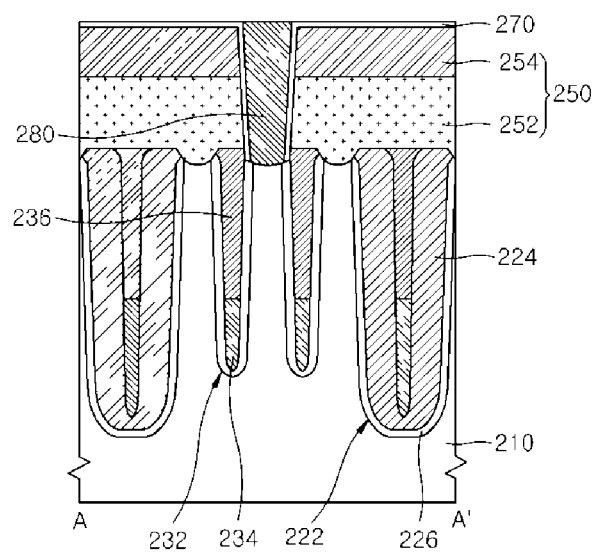
Figure 7C:
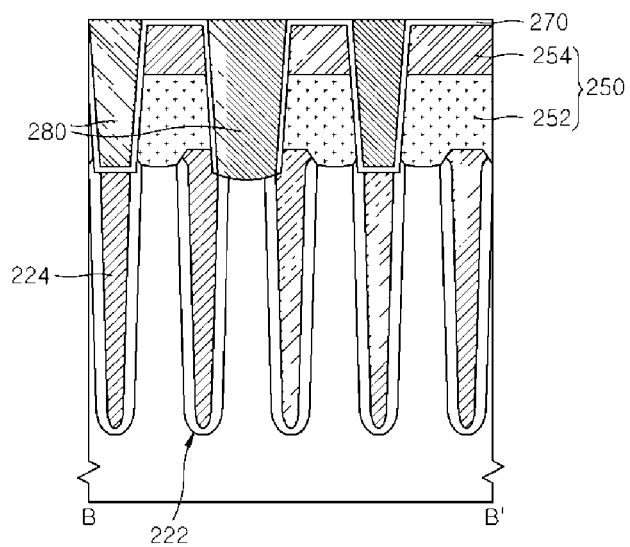

Referring to FIGS. 7A, 7B and 7C, after removal of the resist pattern 272, metallic layers 280 may be formed in respective ones of the bit line trenches 260. As a result, the metallic layers 280 may be electrically connected to the central portions of the active regions 230 through the bit line contact regions 274, and the conductive layer 250 may be electrically insulated from the metallic layers 280 by the separating insulation layer 270 formed on the sidewalls of the bit line trenches 260.

In an embodiment, a method of forming the metallic layers 280 may include sequentially and conformally forming a titanium layer and a titanium nitride layer on the separating insulation layer 270 and in the bit line contact regions 274, forming a tungsten layer on the titanium nitride layer to fill the bit line trenches 260, and planarizing the tungsten layer, the titanium nitride layer and the titanium layer to expose separating insulation layer 270 on a top surface of the conductive layer 250. The titanium layer, the titanium nitride layer and the tungsten layer may be formed using a deposition process, for example, a chemical vapor deposition (CVD) process, a sputtering process, an atomic layer deposition (ALD) process or an evaporation process.

Figure 8A:
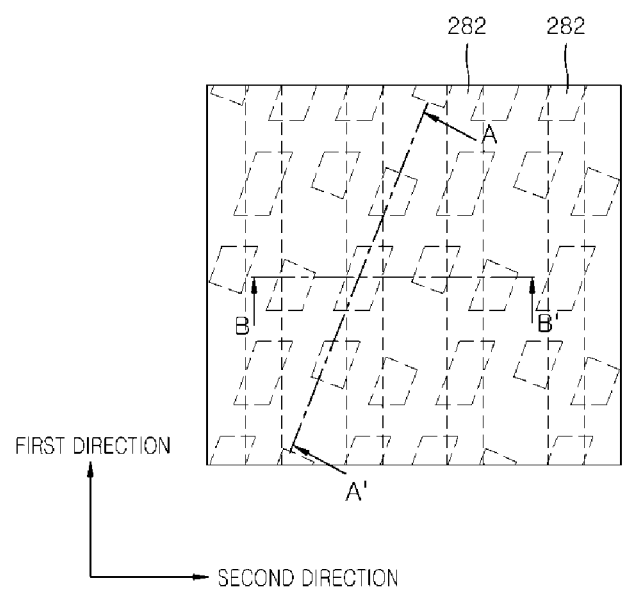
Figure 8B:
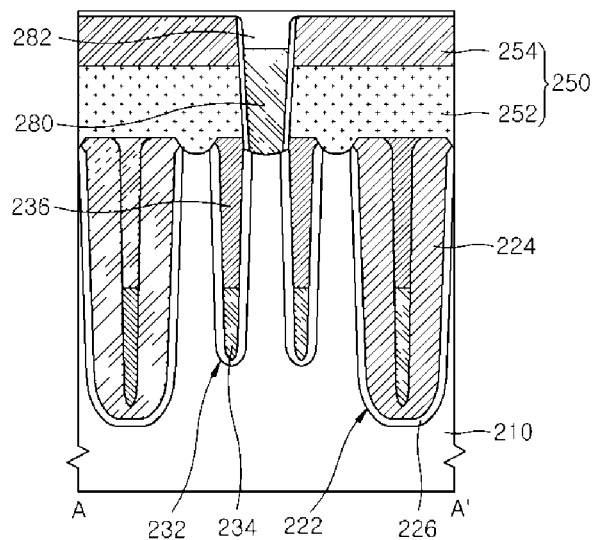
Figure 8C:
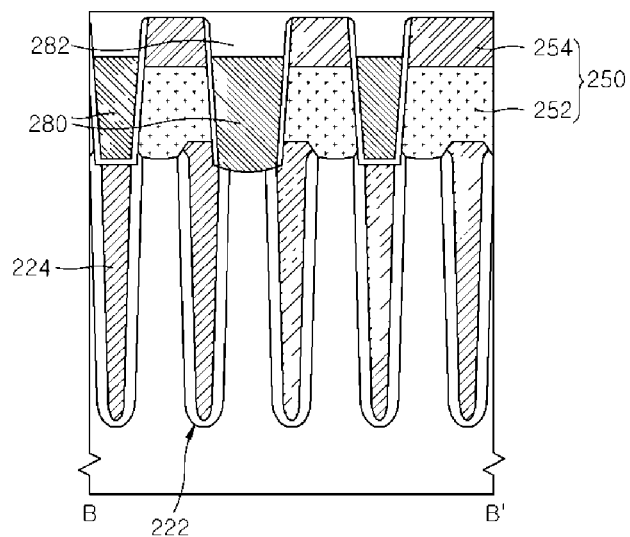

Referring to FIGS. 8A, 8B and 8C, the tungsten layer in the bit line trenches 260 may be etched to recess the tungsten layer, and a sealing insulation layer (e.g., a capping insulation layer) 282 may be formed to fill the bit line trenches 260 on the recessed tungsten layer. The tungsten layer may be recessed using an etch back process. The capping insulation layer 282 may be formed of, for example, a nitride layer, an oxide layer or an oxynitride layer. In an embodiment, the capping insulation layer 282 may be formed of substantially the same material layer as the separating insulation layer 270. In each bit line trench 260, the recessed metallic layer 280 (that is, bit line conductive layer), the capping insulation layer 282 and the separating insulation layer 270 that remains on sidewalls of the the bit line trenches 260 may constitute a bit line pattern. The separating insulation layer 270 may also surround sidewalls of the bit line conductive layer.

Figure 9A:
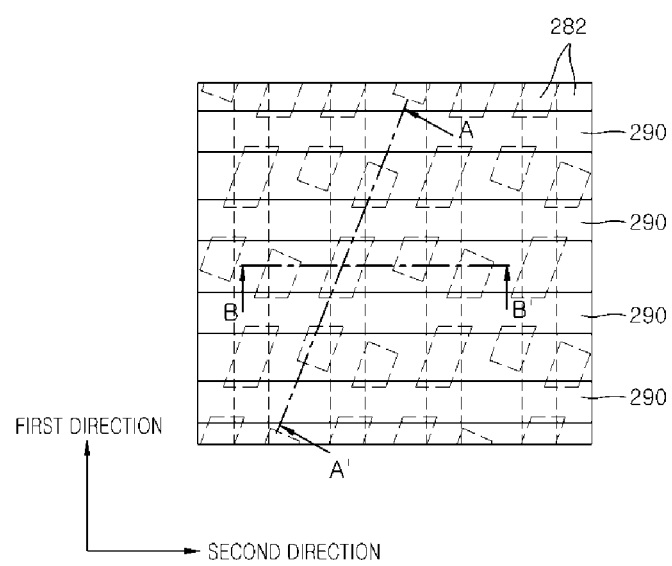

Referring to FIGS. 9A, 9B and 9C, the conductive layer 250 may be etched to form a plurality of plug trenches 290. In an embodiment, the plug trenches 290 may be formed by selectively etching the conductive layer 250 using a mask pattern (not shown) having a plurality of line-shaped openings as an etch mask. The line-shaped openings of the mask pattern may be parallel with the second direction and thus perpendicular to the first direction. While the conductive layer 250 is selectively etched to form the plug trenches 290, the recessed metallic layers 280 (substantially acting as bit lines) may not be etched because of the presence of the capping insulation layer 282 formed on the recessed metallic layers 280. Thus, the plug trenches 290 may be formed to include a plurality of island-shaped contact holes that are two dimensionally arrayed along the first and second directions.

Referring again to FIGS. 9A, 9B and 9C, as a result of the formation of the plug trenches 290, the conductive layer 250 may be divided into a plurality of conductive patterns remaining on both edges of the active regions 230. That is, if the first direction is parallel with columns and the second direction is parallel with rows, the plurality of conductive patterns may be two dimensionally arrayed along the rows and the columns. Thus, the conductive patterns may remain between the plug trenches 290 which are one dimensionally arrayed along the first direction in each column.

In an embodiment, during formation of the plug trenches 290, the conductive layer 250 may be etched using an anisotropic dry etching process utilizing plasma. Thus, each of the plug trenches 290 may be formed to have negative sloped sidewalls because of the nature of the anisotropic dry etching process. That is, an upper width C1 of each plug trench 290 may be greater than a lower width C2 thereof. Thus, the conductive patterns existing between the plug trenches 290 may be formed to have positive sloped sidewalls. As a result, a lower width of each conductive pattern may be greater than an upper width thereof. The sidewall profiles of the plug trenches 290 may be controlled by changing process parameters (e.g., process gases, a process pressure, a plasma condition, or the like) of the anisotropic dry etching process for forming the plug trenches 290.

Figure 10A:
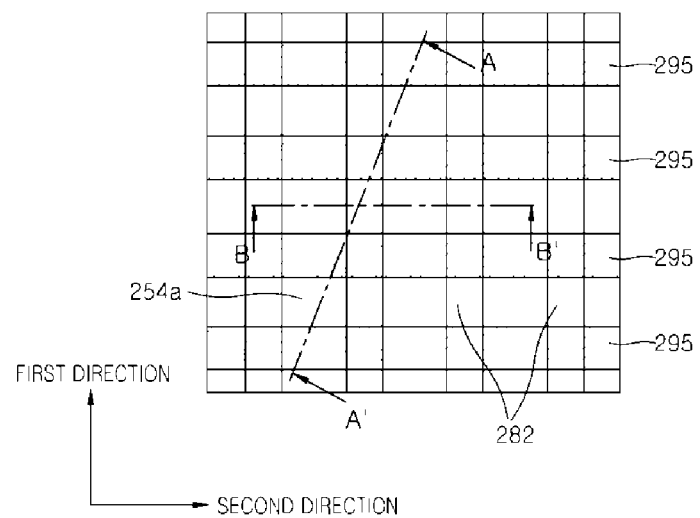
Figure 10B:
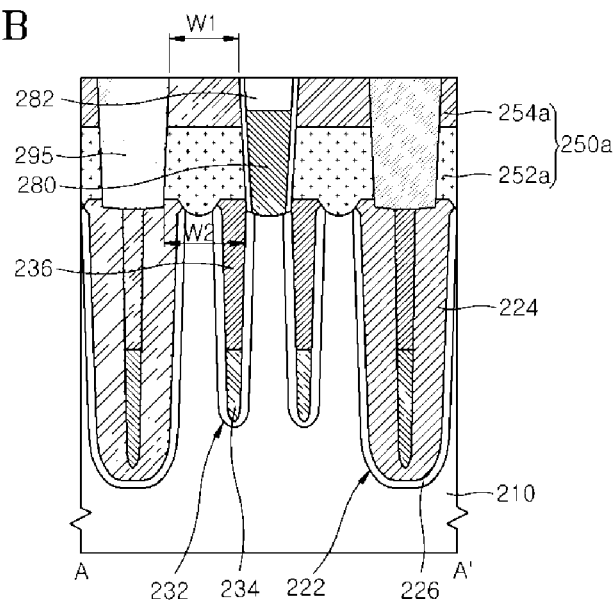
Figure 10C:
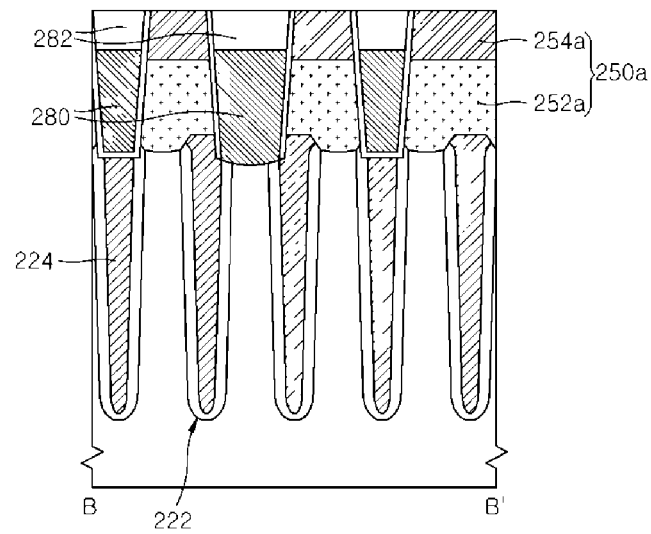

Referring to FIGS. 10A, 10B and 10C, the plug trenches 290 may be filled with an insulation material 295, and the conductive patterns remaining between the plug trenches 290 may be formed on both edges of the active regions 230 to act as conductive plug patterns 250a in portions of the active region. Each of the conductive plug patterns 250a may be formed to include a doped silicon pattern 252a and a metallic pattern 254a sequentially stacked, and the metallic pattern 254a may include a titanium layer (not shown), a titanium nitride layer (not shown), and a tungsten pattern. In an embodiment, the insulation material 295 may be formed of an oxide layer, a nitride layer or an oxynitride layer. The insulation material 295 may be formed by depositing an insulation layer on the substrate including the plug trenches 290 and by etching back or planarizing the insulation layer (or both the insulation layer and the capping insulation layers 282) to expose top surfaces of the conductive plug patterns 250a. As described above, the conductive plug patterns 250a may be formed to remain on both edges of the active regions and an upper width W1 of each conductive plug pattern 250a may be less than a lower width W2 thereof. This configuration may be due to the nature of the anisotropic dry etching process for forming the plug trenches 290.

Figure 11A:
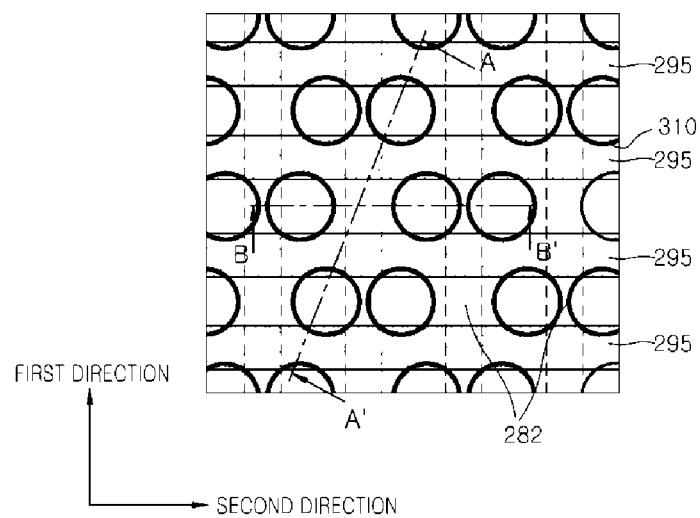
Figure 11B:
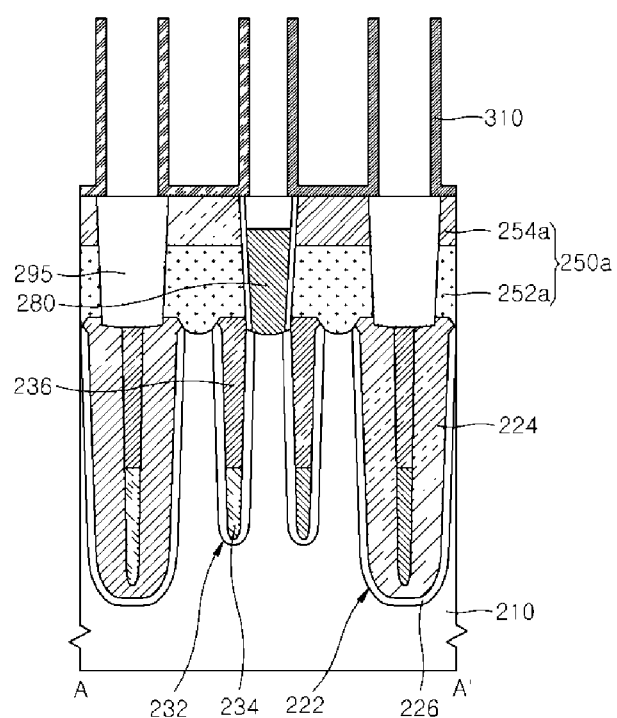
Figure 11C:
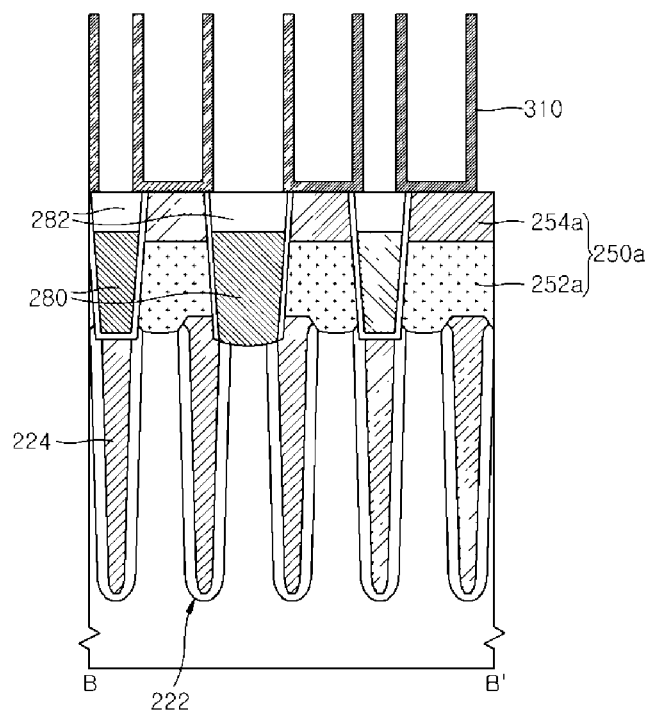

Referring to FIGS. 11A, 11B and 11C, storage node electrodes 310 may be formed on respective ones of the conductive plug patterns 250a. The storage node electrodes 310 may be electrically connected to respective ones of source regions (or drain regions) of transistors formed in the active regions 230 through the conductive plug patterns 250a. As illustrated in FIGS. 11B and 11C, each of the storage node electrodes 310 may be formed to have a cylindrical shape.

According to the example embodiments set forth above, a conductive layer may be formed on a substrate and the conductive layer may be patterned to form a plurality of conductive plug patterns which are two dimensionally arrayed on the substrate. In contrast, the conventional conductive plug patterns are formed by depositing an interlayer insulation layer on a substrate, etching the interlayer insulation layer to form a plurality of contact holes, and filling the contact holes with a conductive material. Thus, the conductive plug patterns according to the example embodiments can be formed without any voids and seams therein, whereas the conventional conductive plug patterns may include voids and/or seams therein. In addition, in embodiments disclosed herein, a lower width of each conductive plug pattern may be greater than an upper width thereof. Accordingly, contact areas between the substrate and the conductive plug patterns can be increased to reduce electrical contact resistance between the substrate and the conductive plug patterns.

Further, according to the aforementioned example embodiments, the conductive layer can be formed of a multi-layered material including a doped silicon layer and a metallic layer. Thus, each of the conductive plug patterns according to the embodiments may also be formed to include a doped silicon pattern and a metallic pattern sequentially stacked. Hence, the conductive plug pattern according to the embodiments may exhibit relatively high electrical conductivity as compared with the conventional conductive plug pattern formed of a single layer of doped silicon material.

Specifically, the conductive plug patterns according to the embodiments can be formed by sequentially depositing the doped silicon layer and the metallic layer on the substrate to form a conductive layer including the doped silicon layer and the metallic layer, annealing the conductive layer to form an ohmic contact between the doped silicon layer and the metallic layer, and patterning the annealed conductive layer. That is, the annealing process for forming an ohmic contact between the doped silicon layer and the metallic layer may be sufficiently performed before the conductive layer is patterned. In contrast, the conventional conductive plug patterns may be formed by depositing a doped silicon layer and a metallic layer on the interlayer insulation layer and in the contact holes, and by planarizing the metallic layer and the doped silicon layer. With the conventional conductive plug patterns, it may be difficult to uniformly perform an annealing process for forming an ohmic contact between the doped silicon layer and the metallic layer. Consequently, electrical conductivity and reliability of the conductive plug patterns, according to the embodiments disclosed herein, can be improved.

The conductive plug patterns according to embodiments of present disclosure can be formed to be electrically insulated from bit lines in a $6F^2$ cell layout and to be located on both edges of active regions defined in the substrate. As such, the conductive plug patterns according to the embodiments may act as storage node contact plugs of DRAM devices that electrically connect the active regions to storage node electrodes.

Furthermore, according to the example embodiments, the conductive plug patterns may be formed without the use of a self-aligned contact (SAC) process. The self-aligned contact process may include selectively etching an interlayer insulation layer to form self-aligned contact holes and filling the self-aligned contact holes with a conductive layer. Thus, the self-aligned contact process may exhibit a relatively narrow process window. However, the conductive plug patterns according to the example embodiments may be formed without the use of a self-aligned contact (SAC) process, as described above. Hence, the methods of manufacturing semiconductor devices according to the example embodiments may exhibit a relatively large process margin as compared with the conventional art.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of manufacturing a semiconductor device, the method comprising:
   forming an isolation region in a substrate to define active regions extending in a single direction and being spaced apart from each other by the isolation region;
   forming a conductive layer on the isolation region and the active regions;
   etching the conductive layer to form bit line trenches extending in a first direction that is non-perpendicular to the single direction;
   forming bit line patterns in the bit line trenches;
   etching the conductive layer to form a plurality of plug trenches two dimensionally arrayed along the first direction and a second direction perpendicular to the first direction; and
   filling the plug trenches with an insulation material to define conductive plug patterns in portions of the active regions.

2. The method of claim 1, further comprising forming word lines in the substrate before the conductive layer is formed on the isolation region and the active regions,
   wherein the word lines are formed to intersect the active regions and extend in the second direction.

3. The method of claim 1, wherein the conductive layer is formed to include at least two layers selected from the group consisting of a doped silicon layer, a titanium (Ti) layer, a titanium nitride (TiN) layer, a tungsten (W) layer, a tungsten nitride (WN) layer, a tantalum (Ta) layer and a tantalum nitride (TaN) layer.

4. The method of claim 1, wherein forming the conductive layer on the isolation region and the active regions includes:
   forming a doped silicon layer in the isolation region and the active regions;
   forming a titanium layer and a titanium nitride layer on the doped silicon layer; and
   forming a tungsten layer on the titanium nitride layer.

5. The method of claim 1, wherein forming the bit line patterns includes:
   forming a separating insulation layer on sidewalls and bottom surfaces of the bit line trenches;
   etching the separating insulation layer using a bit line contact mask as an etch mask to form bit line contact regions that expose portions of the active regions;
   forming a titanium layer and a titanium nitride layer on the separating insulation layer and in the bit line contact regions;
   filling the bit line trenches surrounded by the titanium nitride layer with a tungsten layer;
   recessing the tungsten layer in the bit line trenches; and
   filling the bit line trenches on the recessed tungsten layer with a capping insulation layer.

6. The method of claim 5, wherein the separating insulation layer includes at least one of an oxide layer, a nitride layer and an oxynitride layer.

7. The method of claim 1, wherein etching the conductive layer to form a plurality of plug trenches includes patterning the conductive layer such that the conductive plug patterns remain on both edges of the active regions.

8. The method of claim 1, wherein the conductive plug patterns are formed such that a lower width of each conductive plug pattern is greater than an upper width thereof.

9. The method of claim 1, further comprising forming storage node electrodes on respective ones of the conductive plug patterns.

10. A method of manufacturing a semiconductor device, the method comprising:
    forming an isolation region in a substrate to define active regions extending in a single direction and being spaced apart from each other by the isolation region;
    forming a multi-layered conductive layer on the substrate including the isolation region;
    etching the conductive layer to form first trenches crossing over central portions of the active regions and extending in a first direction that is non-perpendicular to the single direction;
    forming conductive line patterns in the first trenches;
    etching the conductive layer to form a plurality of second trenches two dimensionally arrayed along the first direction and a second direction perpendicular to the first direction; and
    filling the second trenches with an insulation material to define conductive plug patterns on portions of the active regions.

11. The method of claim 10, wherein forming the multi-layered conductive layer includes:
    forming a doped silicon layer on the substrate including the isolation region;
    forming a titanium layer and a titanium nitride layer on the doped silicon layer; and
    forming a tungsten layer on the titanium nitride layer.

12. The method of claim 10, wherein forming the conductive line patterns includes:
    forming a separating insulation layer on sidewalls and bottom surfaces of the first trenches;
    etching the separating insulation layer to form contact regions that expose portions of the active regions;
    forming a titanium layer and a titanium nitride layer on the separating insulation layer and in the contact regions;
    filling the first trenches surrounded by the titanium nitride layer with a tungsten layer;
    recessing the tungsten layer in the first trenches; and
    filling the first trenches on the recessed tungsten layer with a capping insulation layer.

13. The method of claim 10, further comprising forming conductive lines in the substrate before the multi-layered conductive layer is formed on the substrate,
    wherein the conductive lines are formed to intersect the active regions and extend in the second direction.

14. The method of claim 10, wherein the conductive plug patterns are formed such that a lower width of each conductive plug pattern is greater than an upper width thereof.

15. A semiconductor device comprising:
    active regions disposed in a substrate to extend along a single direction and insulated from each other by an isolation region;
    bit line patterns crossing over the active regions and extending in a first direction that is non-perpendicular to the single direction; and
    conductive plug patterns disposed between the bit line patterns and two dimensionally arrayed along the first direction and a second direction perpendicular to the first direction,
    wherein the conductive plug patterns are disposed in portions of the active regions.

16. The semiconductor device of claim 15, wherein a lower width of each of the conductive plug patterns is greater than an upper width thereof.

17. The semiconductor device of claim 15, wherein each of the conductive plug patterns includes at least two layers selected from the group consisting of a doped silicon layer, a titanium (Ti) layer, a titanium nitride (TiN) layer, a tungsten (W) layer, a tungsten nitride (WN) layer, a tantalum (Ta) layer and a tantalum nitride (TaN) layer.

18. The semiconductor device of claim 15, wherein each of the conductive plug patterns includes a doped silicon layer, a titanium (Ti) layer, a titanium nitride (TiN) layer and a tungsten (W) layer which are sequentially stacked.

19. The semiconductor device of claim 15, wherein each of the bit line patterns includes:
    a bit line conductive layer;
    a separating insulation layer surrounding sidewalls of the bit line conductive layer; and
    a capping insulation layer on a top surface of the bit line conductive layer.

20. The semiconductor device of claim 15, wherein the conductive plug patterns are disposed on both edges of the active regions.

* * * * *